(12) United States Patent
Usami

(10) Patent No.: US 6,420,007 B2
(45) Date of Patent: Jul. 16, 2002

(54) RECORDING MEDIUM AND METHOD OF MANUFACTURING SAME

(75) Inventor: Yoshihisa Usami, Odawara (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 39 days.

(21) Appl. No.: 09/735,610

(22) Filed: Dec. 14, 2000

(30) Foreign Application Priority Data

Dec. 14, 1999 (JP) ............................................ 11-354356

(51) Int. Cl.$^7$ ................................................. B32B 3/02
(52) U.S. Cl. ..................... 428/64.1; 428/64.4; 428/64.8; 204/192.12
(58) Field of Search .................. 428/64.1, 64.4, 428/64.8, 457, 913; 430/270.11, 495.1, 745; 204/192.1, 192.12

(56) References Cited

U.S. PATENT DOCUMENTS

| 5,512,150 A | * | 4/1996 | Bourez | 204/192.12 |
| 5,589,040 A | | 12/1996 | Nishimura | 204/192.26 |
| 5,693,199 A | * | 12/1997 | Bourez | 204/192.12 |
| 6,093,290 A | * | 7/2000 | Tamura | 204/192.12 |

FOREIGN PATENT DOCUMENTS

| JP | 2-300288 | 12/1990 | ............ C09K/15/20 |
| JP | 3-224793 | 10/1991 | ............ B41M/5/26 |
| JP | 4-146189 | 5/1992 | ............ B41M/5/26 |

OTHER PUBLICATIONS

Japanese Abstract No. 08236062, dated Sep. 13, 1996.
Japanese Abstract No. 10088341, dated Apr. 7, 1998.
Japanese Abstract No. 08081769, dated Mar. 26, 1996
Japanese Abstract No. 62017174, dated Jan. 26, 1987.
Japanese Abstract No. 07262633, dated Oct. 13, 1995.
Japanese Abstract No. 09125247, dated May 13, 1997.
Japanese Abstract No. 06025845, dated Feb. 1, 1994.
Japanese Abstract No. 11144338, dated May 28, 1999.
Patent Abstract of Japan 04146189 A, May 20, 1992.
Patent Abstract of Japan 02300288 A, Dec. 12, 1990.
Patent Abstract of Japan 03224793 A, Oct. 3, 1991.

* cited by examiner

Primary Examiner—Elizabeth Evans
(74) Attorney, Agent, or Firm—Sughrue Mion, PLLC

(57) ABSTRACT

A recording medium is fabricated by forming a light reflecting layer on a dye recording layer capable of recording information, with a sputtering mechanism. The sputtering mechanism has a target, an electromagnet in the shape of a solenoid disposed in horizontally facing relationship to the target, and a coaxial cylindrical permanent magnet disposed in vertically facing relationship to the target. The permanent magnet has an outer circumferential region serving as an N pole and an inner circumferential region serving as an S pole. The electromagnet is electrically connected to a DC power supply via a controller which controls the intensity of a current flowing through the electromagnet.

12 Claims, 15 Drawing Sheets

F I G. 3
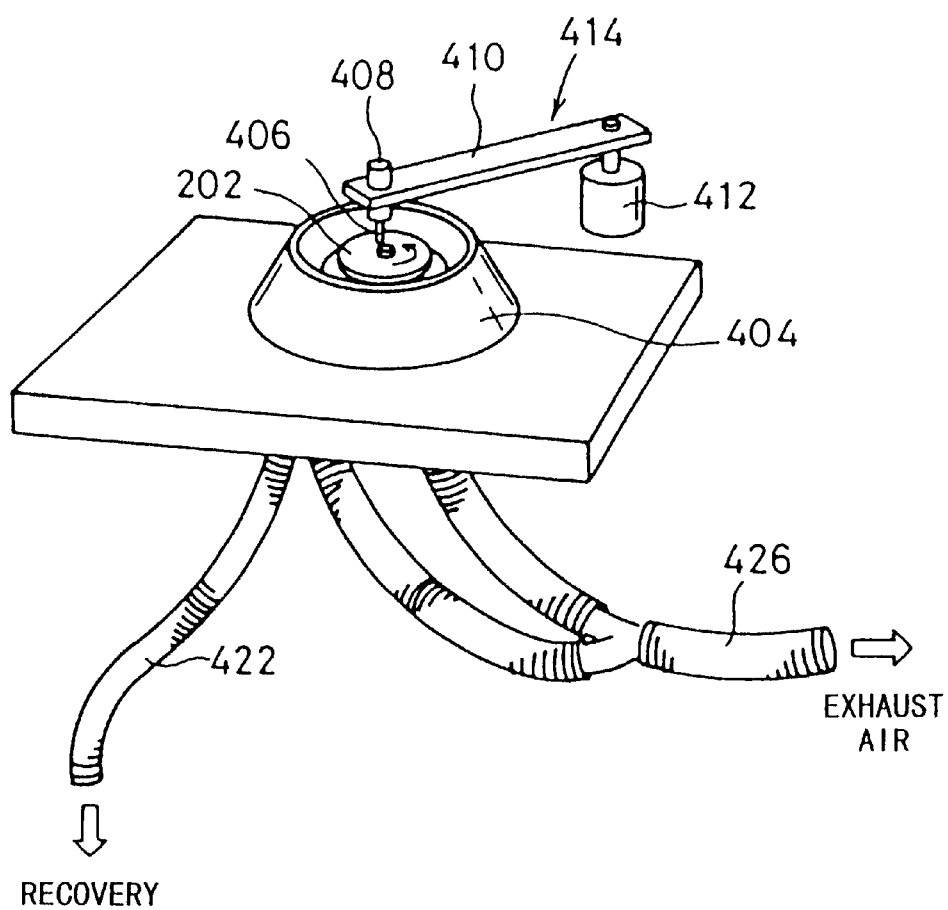

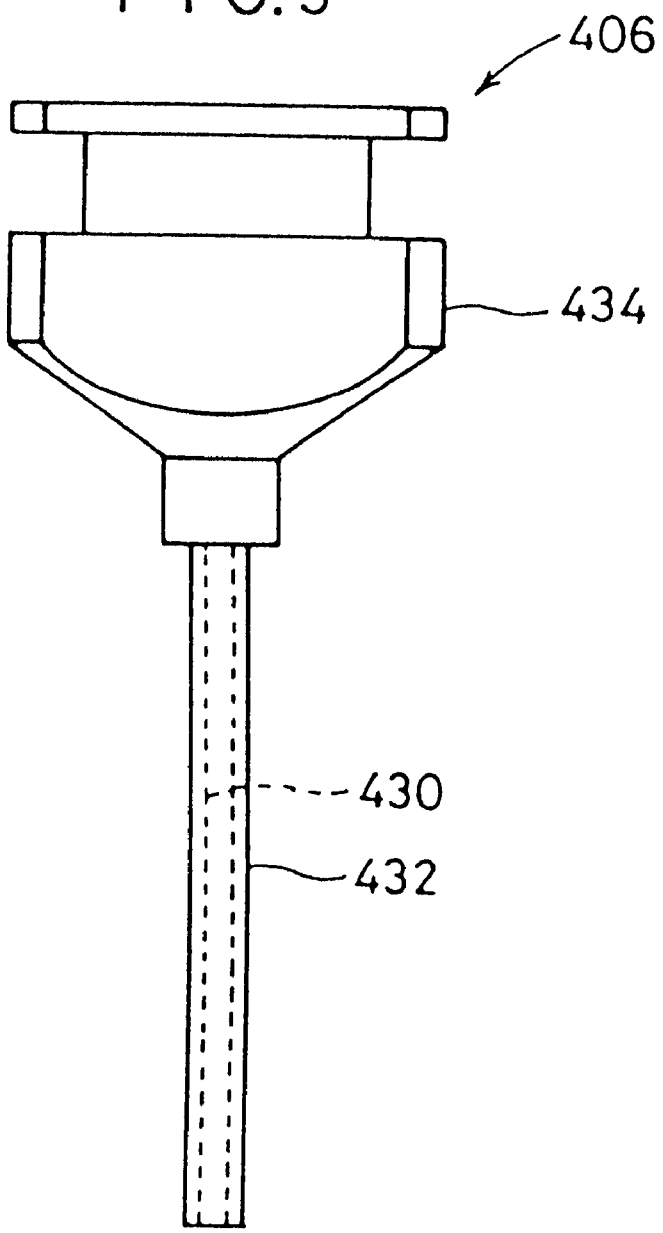
F I G. 5

FIG. 14

|  |  | INVENTIVE EXAMPLE 1 | INVENTIVE EXAMPLE 2 | COMPARATIVE EXAMPLE 1 | COMPARATIVE EXAMPLE 2 |
|---|---|---|---|---|---|
| FILM THICKNESS (nm) | INNER CIRCUMFERENTIAL PORTION | 80 | 81 | 80 | 100 |
|  | OUTER CIRCUMFERENTIAL PORTION | 79 | 80 | 65 | 81 |
| 11T LAND JITTER (nm) | INNER CIRCUMFERENTIAL PORTION | 32 | 31 | 33 | 34 |
|  | OUTER CIRCUMFERENTIAL PORTION | 31 | 32 | 37 | 36 |

RECORDING MEDIUM AND METHOD OF MANUFACTURING SAME

BACKGROUND OF THE INVENTION

1. Field of the Invention

The present invention relates to a recording medium having a recording layer for capable of recording information and a light reflecting layer which are disposed on a substrate and a method of manufacturing such a recording medium, and more particularly to a recording medium having such a light reflecting layer formed by sputtering and a method of manufacturing such a recording medium.

2. Description of the Related Art

Usually, a light reflecting layer of a recording medium which has a recording layer capable of recording information is formed by sputtering. FIG. 15 of the accompanying drawings shows a sputtering mechanism 1 for performing such a sputtering process. As shown in FIG. 15, the sputtering mechanism 1 has a target 3 (light reflecting layer material) disposed above a substrate 2 in confronting relationship thereto and supporting a permanent magnet 4 on its upper surface. An atmospheric gas, e.g., an Ar gas, is introduced into a space between the substrate 2 and the target 3, and a certain voltage is applied between the substrate 2 and the target 3 to generate a plasma 7 therebetween. The plasma 7 causes Ar ions 5 to impinge upon the target 3, which then discharges atoms 6 that are deposited on the substrate 2.

However, since the intensity and distribution of a magnetic field produced by the permanent magnet 4 are constant, the sputtering process performed by the sputtering mechanism 1 is disadvantageous in that Ar ions 5 tend to concentrate on and hit a certain area of the target 3.

As a result, atoms 6 discharged from the target 3 are liable to be deposited unevenly on the substrate 2, forming a light reflecting layer of irregular film thickness on a recording layer on the substrate 2. The irregular film thickness of the light reflecting layer changes the manner in which heat is transferred depending on the position accessed by a laser beam, so that the size of pits tends to vary from accessed position to accessed position. Such varying pit sizes are liable to increase jitter in recorded information. In addition, the localized impingement of the Ar ions 5 upon the target 3 is apt to shorten the service life of the target 3.

SUMMARY OF THE INVENTION

It is therefore an object of the present invention to provide a recording medium which has a light reflecting layer formed substantially uniformly on a substrate for reduced jitter, and a method of manufacturing such a recording medium using a target whose service life is prolonged.

According to an aspect of the present invention, there is provided a recording medium comprising a substrate, a recording layer disposed on the substrate for recording information, and a light reflecting layer disposed on the substrate, the light reflecting layer being formed on the recording layer by a sputtering mechanism having a permanent magnet, an electromagnet, and a target while the intensity and distribution of a magnetic field generated by the permanent magnet and the electromagnet is being controlled by a controller.

According to another aspect of the present invention, there is also provided a method of manufacturing a recording medium having a substrate, a recording layer disposed on the substrate for recording information, and a light reflecting layer disposed on the substrate, comprising the step of forming the light reflecting layer on the recording layer with a sputtering mechanism having a permanent magnet, an electromagnet, and a target while the intensity and distribution of a magnetic field generated by the permanent magnet and the electromagnet is being controlled by a controller.

According to still another aspect of the present invention, there is also provided a method of manufacturing a recording medium having a substrate, a recording layer disposed on the substrate for recording information, and a light reflecting layer disposed on the substrate, comprising the step of forming the light reflecting layer on the recording layer with a sputtering mechanism having a permanent magnet and a target while the intensity and distribution of a magnetic field generated by the permanent magnet is being changed by displacing the permanent magnet parallel to the substrate.

According to yet another aspect of the present invention, there is also provided a method of manufacturing a recording medium having a substrate, a recording layer disposed on the substrate for recording information, and a light reflecting layer disposed on the substrate, comprising the step of forming the light reflecting layer on the recording layer with a sputtering mechanism having an electromagnet and a target while the intensity and distribution of a magnetic field generated by the electromagnet is being controlled by a controller.

With the above arrangement, the light reflecting layer may be formed substantially uniformly on the substrate for reduced jitter, and the target may be of an increased service life.

A direct current may flow through the electromagnet. The permanent magnet may be of a coaxial cylindrical shape or a bar shape. The permanent magnet may comprise an annular array of bar-shaped permanent magnets.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is a perspective view of the spin coating device;

FIG. 5 is a side elevational view of the nozzle;

FIG. 14 is a diagram showing a table of experimental results; and

DESCRIPTION OF THE PREFERRED EMBODIMENTS

Figure 1:
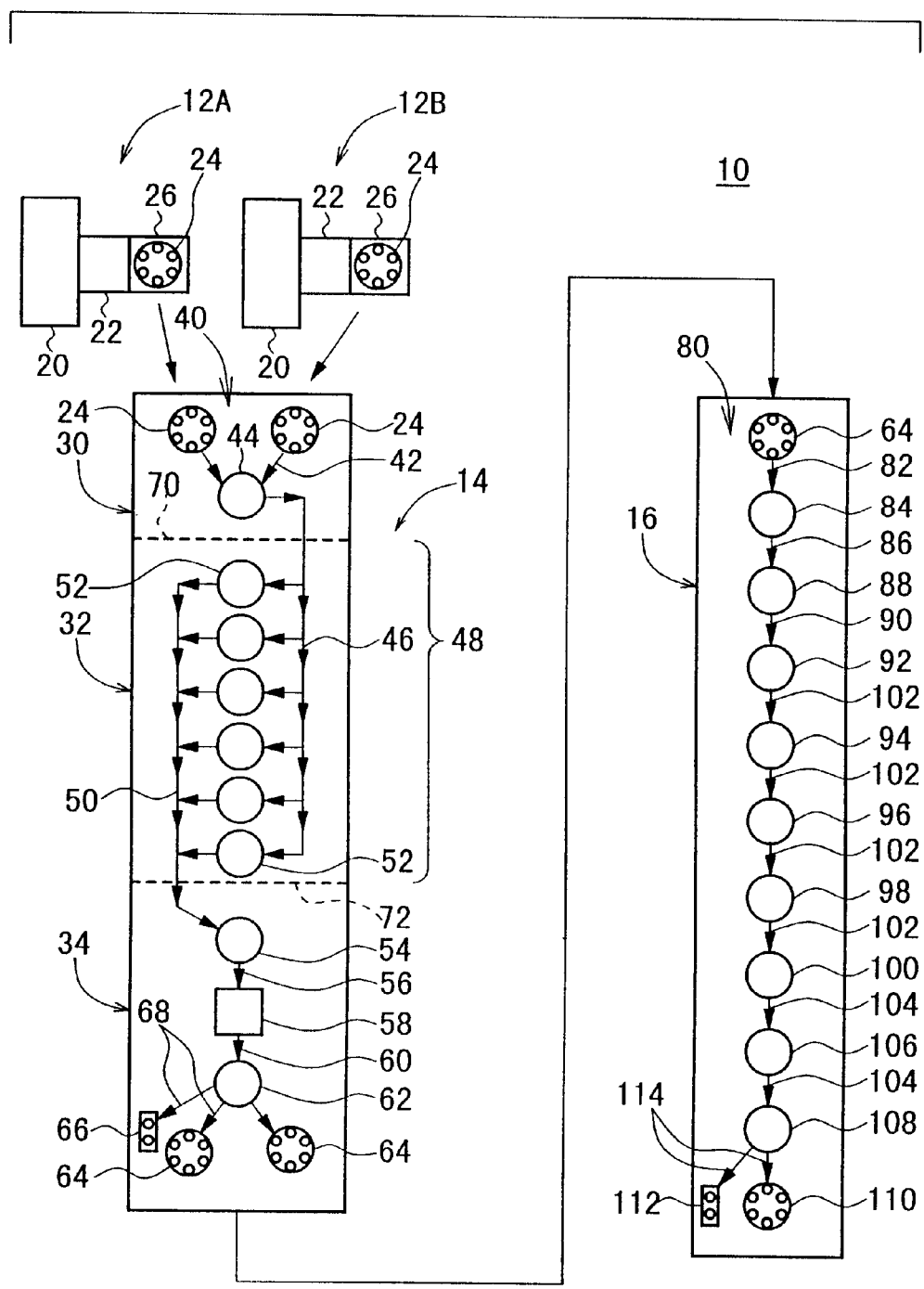
FIG. 1 is a schematic plan view of a production system for carrying out a method of manufacturing a recording medium according to a first embodiment of the present invention.

As shown in FIG. 1, a production system 10 for carrying out a method of manufacturing an information recording medium according to a first embodiment of the present invention generally comprises two injection molding facilities (first and second molding facilities) 12A, 12B for producing a substrate by injection molding, compression molding or injection compression molding, a coating facility 14 for coating and drying a dye solution on one principal surface of a substrate 202 to produce dye recording layers on the substrate 202, and a post-treatment facility 16 for forming a light reflecting layer on the dye recording layer of a substrate 202 by sputtering, for example, coating an UV-curable solution on the dye recording layer on the substrate, and applying ultraviolet rays to the coated UV-curable solution to cure the coated UV-curable solution thereby to form a protective layer on the light reflecting layer on the substrate.

Each of the first and second molding facilities 12A, 12B comprises a molding machine 20 for producing a substrate 202 (see FIG. 7A) which has tracking grooves or grooves (recesses and protrusions) 200 formed on a principal surface thereof as representing information such as address signals, by molding a resin material such as polycarbonate by injection molding, compression molding, or injection compression molding, a cooling unit 22 for cooling the substrate 202 discharged from the molding machine 20, and a stacking unit (stack pole rotary table) 26 having a plurality of stack poles 24 for stacking and storing cooled substrates 202.

The coating facility 14 comprises first, second, and third processing stations 30, 32, 34. The first, processing station 30 comprises a stack pole storage unit 410 for storing stack poles 24 that are delivered from the first and second molding facilities 12A, 12B, a first feed mechanism 42 for taking one at a time of the substrates 202 stacked on the stack poles 24 and feeding the substrate 202 to a next process, and an electrostatic blowing mechanism;44 for removing electrostatic charges from each substrate 202 fed by the first feed mechanism 42.

The second processing station 32 comprises a second feed mechanism 46 for successively feeding substrates 202 from which electrostatic charges have been removed by the electrostatic blowing mechanism 44 in the first processing station 30 to a next process, a dye coating mechanism 48 for coating a dye solution to a plurality of substrates 202 fed by the second feed mechanism 46, and a third feed mechanism 50 for feeding one at a time of substrates 202 which have been coated with the dye solution. The dye coating mechanism 48 has an array of six spin coating devices 52.

The third processing station 34 has a reverse cleaning mechanism 54 for cleaning the reverse side of a substrate 202 fed by the third feed mechanism 50, a fourth feed mechanism 56 for feeding a substrate 202 whose reverse side has been cleaned by the reverse cleaning mechanism 54, a number assigning mechanism 58 for assigning a lot number, etc. to a substrate 202 fed by the fourth feed mechanism 56 by ink jet printing, a fifth transport mechanism 60 for transporting, to the next step, the substrate 202 completed for the ink jet printing of the lot number or the like, a film thickness inspecting mechanism 62 for inspecting any defect of the substrate 202 and the film thickness of the dye recording layer on the substrate 202 delivered by the fifth feed mechanism 60, and a sorting mechanism 68 for sorting the substrate 202 selectively to a stack pole 64 for normal substrates and a stack pole 66 for defective substrates depending on the inspected result from the film thickness inspecting mechanism 62.

A first partition plate 70 is disposed between the first processing station 30 and the second processing station 32, and a second partition plate 72 is disposed between the second processing station 32 and the third processing station 34. The first partition plate 70 has an opening (not shown) defined in a lower portion thereof which is large enough not to close a feed path for substrates 202 that are fed by the second feed mechanism 46, and the second partition plate 72 has an opening (not shown) defined in a lower portion thereof which is large enough not to close a feed path for substrates 202 that are fed by the third feed mechanism 50.

The post-treatment facility 16 comprises a stack pole storage unit 80 for storing stack poles 64 for normal substrates 202 that are delivered from the coating facility 14, a sixth feed mechanism 82 for taking one at a time of the substrates 202 stacked on the stack poles 64 stored in the stack pole storage unit 80 and feeding the substrate 202 to a next process, a first electrostatic blowing mechanism 84 for removing electrostatic charges from each substrate 202 fed by the sixth feed mechanism 82, a seventh feed mechanism 86 for successively feeding substrates 202 from which electrostatic charges have been removed by the first electrostatic blowing mechanism 84 to a next process, a sputtering mechanism 88 for forming a light reflecting layer on a principal surface of a substrate 202 fed by the seventh feed mechanism 86 by sputtering, an eighth feed mechanism 90 for successively feeding substrates 202 on which light reflecting layers have been formed, and an edge cleaning mechanism 92 for cleaning an peripheral edge of the substrate 202 fed by the eighth feed mechanism 90.

The post-treatment facility 16 also has a second electrostatic blowing mechanism 94 for removing electrostatic charges from each substrate 202 whose edge has been cleaned by the edge cleaning mechanism 92, an UV-curable solution coating mechanism 96 for coating an UV-curable solution on the principal surface of the substrate 202 from which electrostatic charges have been removed by the second electrostatic blowing mechanism 94, a spinning mechanism 98 for spinning the substrate 202 which has been coated with the UV-curable solution at a high speed to uniformize the coated thickness of the UV-curable solution, an UV applying mechanism 100 for applying ultraviolet rays to the principal surface of the substrate 202 which has been coated with the UV-curable solution and spun to cure the coated UV-curable solution thereby to form a protective layer on the principal surface of the substrate 202, a ninth feed mechanism 102 for feeding substrates 202 to the second electrostatic blowing mechanism 94, the UV-curable solution coating mechanism 96, the spinning mechanism 98, and the UV applying mechanism 100, a tenth feed mechanism 104 for feeding a substrate 202 to which ultraviolet rays have been applied to a next process, a defect inspecting mechanism 106 for inspecting, for defects, the coated surface and the protective layer surface of the substrate 202 delivered by the tenth feed mechanism 104, a characteristic inspecting mechanism 108 for inspecting signal characteristics due to grooves 200 formed in the substrate 202, and a sorting mechanism 114 for sorting the substrate 202 selectively to a stack pole 110 for normal substrates and a stack pole 112 for defective substrates depending on the inspected results from the defect inspecting mechanism 106 and the characteristic inspecting mechanism 108.

Structural details of each of the spin coating devices 52 will be described below with reference to FIGS. 2 through 6.

Figure 2:
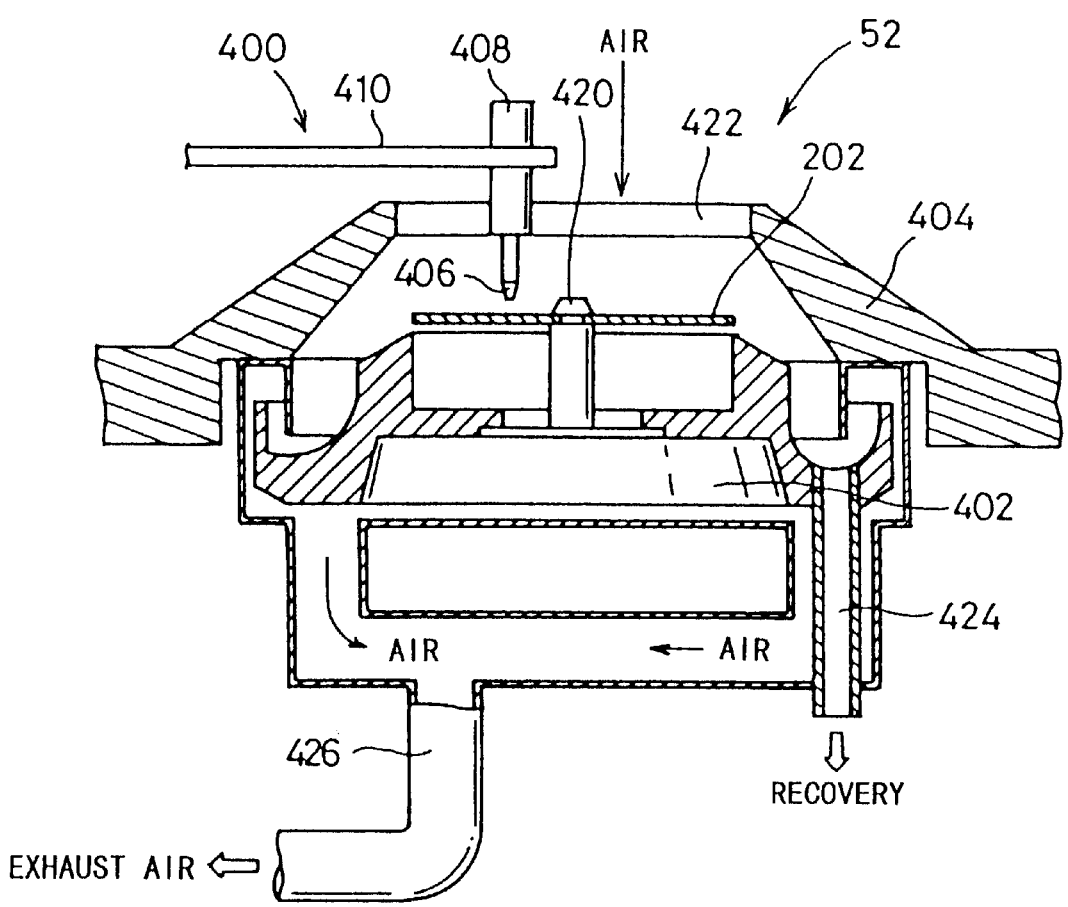
FIG. 2 is a fragmentary cross-sectional view of a spin coating device installed in a coating facility of the production system.

As shown in FIGS. 2 and 3, the spin coating device 52 has a coating solution applicator 400, a spinner head 402, and a scattering prevention wall 404. The coating solution applicator 400 has a pressurizing tank (not shown) filled with a coating solution, a pipe (not shown) extending from the pressurizing tank to a nozzle 406, and a discharged solution regulating valve 408 for regulating the amount of the coating solution discharged from the nozzle 406. The adjusted amount of the coating solution discharged from the nozzle 406 is dropped onto the surface of the substrate 202.

The coating solution applicator 400 can be angularly moved from a standby position to a position over the substrate 202 by a handling mechanism 414. The handling mechanism 414 has a support plate 410 which supports the nozzle 406 with its orifice oriented downwardly, and a motor 412 for turning the support plate 410 horizontally.

The spinner head 402 is disposed below the coating solution applicator 400. The spinner head 402 has a fixture 420 by which the substrate 202 is detachably held in a horizontal plane. The spinner head 402 has its own vertical shaft rotatable about its own axis by a motor (not shown).

When the substrate 202 held horizontally by the fixture 420 is rotated by the motor, the coating solution is dropped from the nozzle 406 of the coating solution applicator 400 onto the surface of the substrate 202 and flows radially outwardly on the surface of the substrate 202 under centrifugal forces. An excessive amount of the coating solution that flows radially outwardly beyond the outer circumferential edge of the substrate 202 is thrown off the substrate 202 under centrifugal forces. The coating solution that remains on the surface of the substrate 202 is dried into a coated film as the dye recording layer 204.

The scattering prevention wall 404 is provided to prevent the excessive amount of the coating solution that is thrown off the substrate 202 from being scattered around the spin coating device 52. The scattering prevention wall 404 is of an annular shape extending around the spinner head 402 with an opening 422 defined over the spinner head 402. The excessive amount of the coating solution that is thrown off the substrate 202 is collected by the scattering prevention wall 404 and recovered through a drain pipe 424.

In the second processing station 32 (see FIG. 1), each of the spin coating devices 52 performs a localized discharging of air therethrough. Specifically, air is introduced from the opening 422 in the scattering prevention wall 404 into the spin coating device 52, flows onto and-along the surface of the substrate 202 on the fixture 420, and is discharged through a discharge pipe 426 extending downwardly from the spinner head 402.

Figure 4:
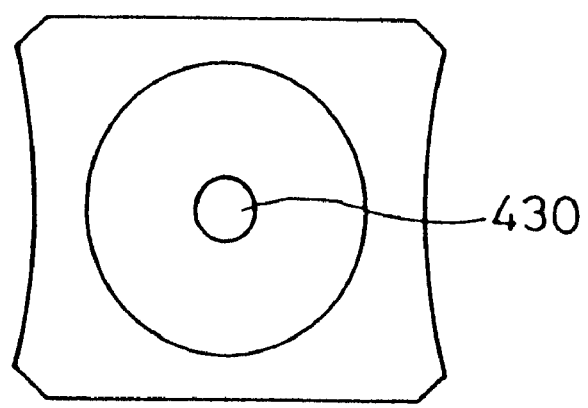
FIG. 4 is a plan view of a nozzle of the spin coating device.

As shown in FIGS. 4 and 5, the nozzle 406 of the coating solution applicator 400 includes a slender cylindrical main nozzle body 432 having a through-hole 430 formed therethrough in the axial direction, and an attachment section 434 for fixing the main nozzle body 432 to the support plate 410 (see FIG. 3). The main nozzle body 432 has the following surface. That is, the forward end surface 440 and the outer or inner wall surface or both of the outer and inner wall surfaces 442, 444 ranging over a distance of not less than 1 mm from the forward end surface 440 are composed of a fluorine compound. Those usable as the fluorine compound include, for example, polytetrafluoroethylene and polytetrafluoroethylene-containing substances.

Figure 6:
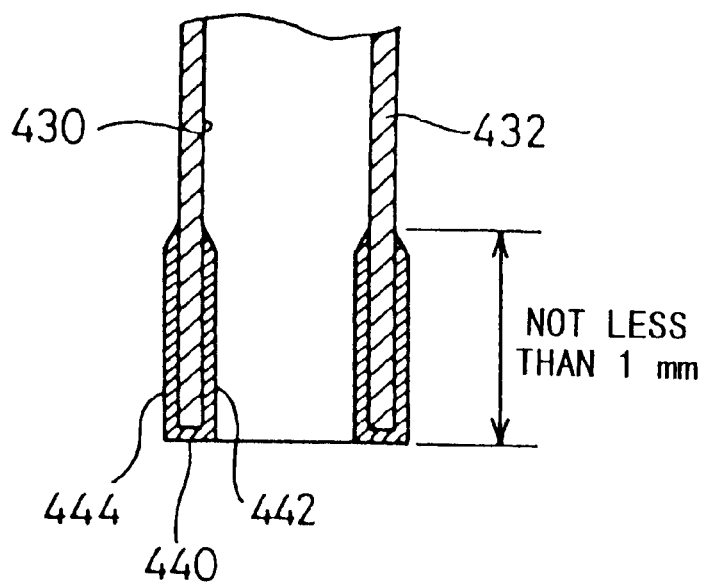
FIG. 6 is an enlarged fragmentary cross-sectional view of another nozzle with partial omission.

Preferred examples of the nozzle 406 to be used in this embodiment include, for example, the nozzle 406 in which the portion, which includes the forward end surface of the main nozzle body 432 and which ranges over a distance of not less than 1 mm from the forward end surface, is formed by using the fluorine compound as shown in FIG. 5, and a nozzle 406 in which the portion, which includes the forward end surface 440 of the main nozzle body 432 and which includes the outer or inner wall surface or both of the outer and inner wall surfaces 442, 444 ranging over a distance of not less than 1 mm from the forward end surface 440, is coated with the fluorine compound as shown in FIG. 6.

When the portion, which includes the forward end surface 440 of the main nozzle body 432 and which ranges over the distance of not less than 1 mm from the forward end surface 440, is formed of the fluorine compound, the following arrangement is preferable from a practical viewpoint considering, for example, the strength. That is, for example, the main nozzle body 432 is formed of stainless steel. Further, the forward end surface 440 and the portion ranging over a distance of 5 mm at the maximum from the forward end surface 440 are formed of the fluorine compound.

Figure 15:
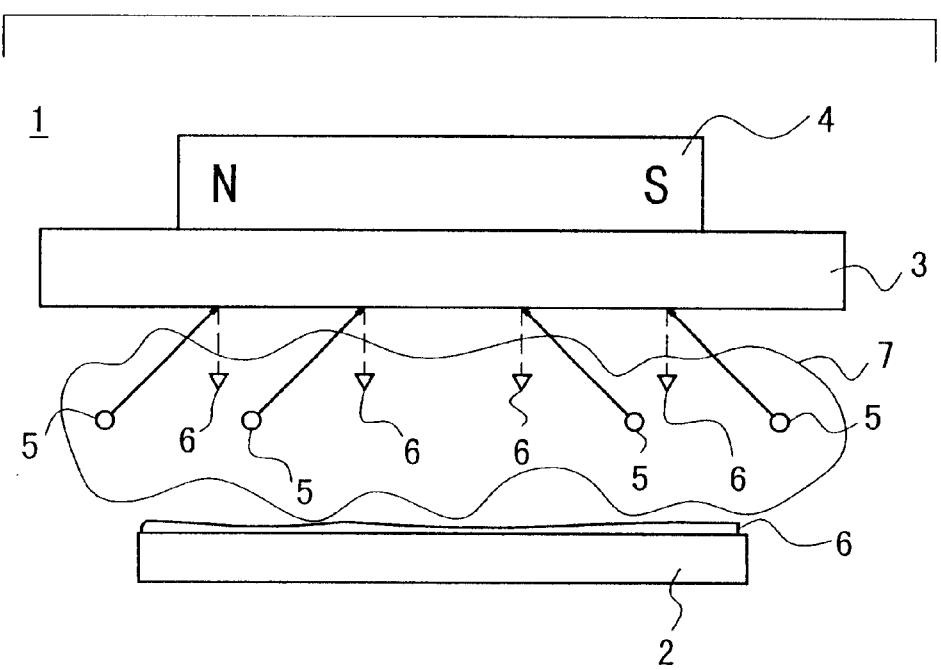
FIG. 15 is a schematic side elevational view of a conventional sputtering mechanism.

When the portion, which includes the forward end surface 440 of the main nozzle body 432 and which includes the outer or inner wall surface or both of the outer and inner wall surfaces 442, 444 ranging over the distance of not less than 1 mm from the forward end surface 440, is coated with the fluorine compound as shown in FIG. 15, it is preferable that an area ranging over a distance of not less than 10 mm from the forward end surface 440 of the main nozzle body 432 is coated with the fluorine compound. It is more preferable that the entire area of the main nozzle body 432 is coated with the fluorine compound. When the area as described above is coated, the thickness is not specifically limited. However, the thickness is appropriately within a range of 5 to 500 μm. The material for the main nozzle body 432 is preferably stainless steel as described above. The diameter of the through-hole 430 formed through the main nozzle body 432 is generally within a range of 0.5 to 1.0 mm.

The sputtering mechanism 88 for forming a light reflecting layer 208 will be described below with reference to FIG. 7.

Figure 7:
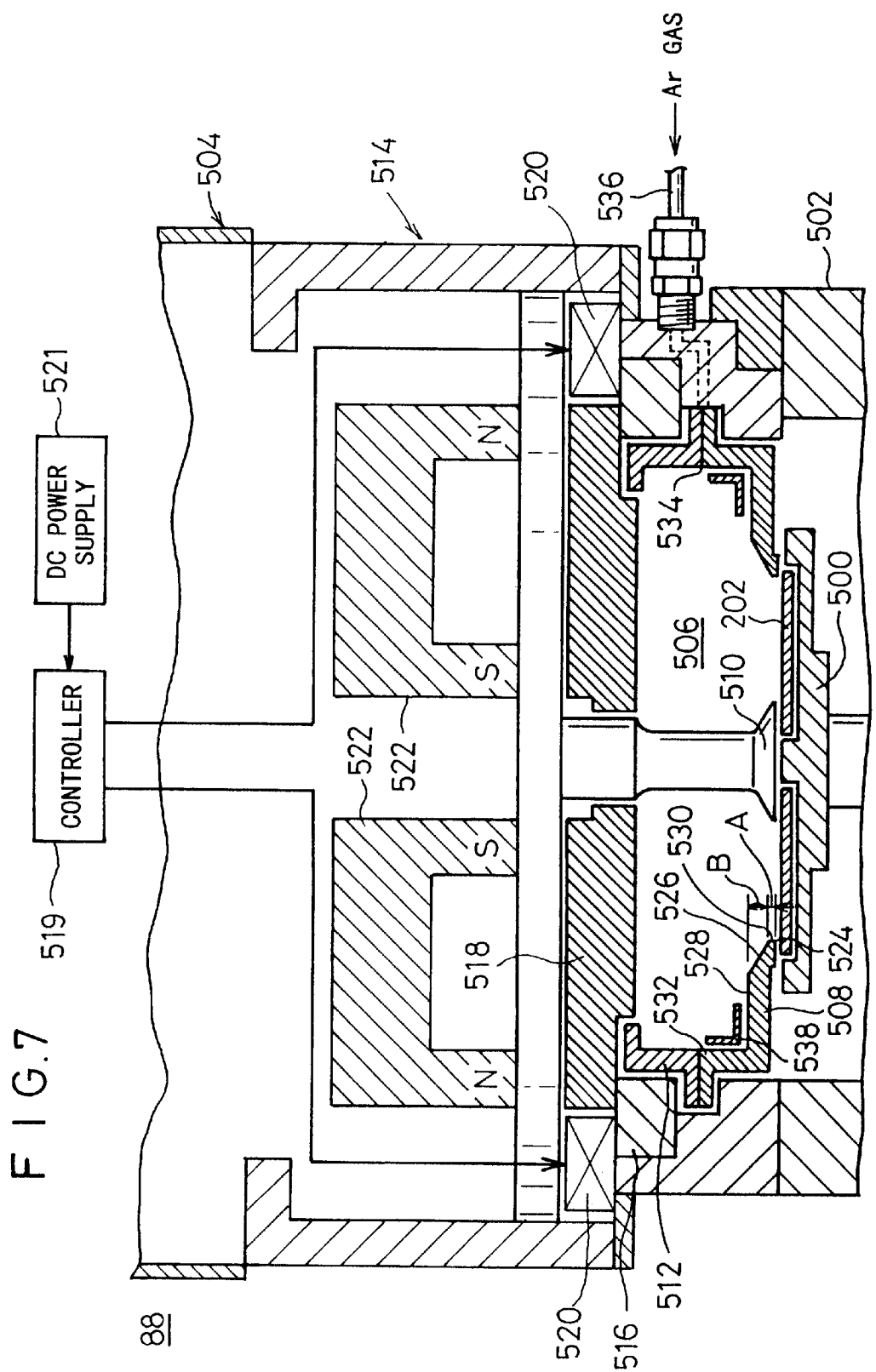
FIG. 7 is a fragmentary vertical cross-sectional view of a sputtering mechanism in the production system according to the first embodiment.

As shown in FIG. 7, the sputtering mechanism 88 comprises a tubular chamber 502 housing a rotary table 500 therein and having an upper opening, and a sputtering source 504 disposed openably and closably with respect to the upper opening of the tubular chamber 502.

When the sputtering source 504 is closed with respect to the upper opening of the tubular chamber 502, a sputtering space 506 is formed above the rotary table 500. The sputtering space 506 can be evacuated to a certain level of vacuum via an evacuating hole (not shown) by a vacuum pump or not. A substrate 202 is placed on the rotary table 500 and rotatable therewith by a motor coupled to the rotary table 500.

The sputtering source 504 has, in its lower region, an outer mask 508 for masking an outer circumferential area of the substrate 202 in a sputtering process that is effected on the substrate 202, an inner mask 510 for masking a central area of the substrate 202 in a sputtering process that is effected on the substrate 202, an upper mask 512 disposed above the outer mask 508, a support member 514 which securely supports the outer mask 508, the inner mask 510, and the upper mask 512, a target 518 of Ag, for example, disposed in confronting relationship to the substrate 202 placed on the rotary table 500 and supported by an insulating ring 516 in insulated relationship to the masks 508, 510, 512, and an electromagnet 520 in the shape of a solenoid disposed at the boundary between the support member 514 and the insulating ring 516 in horizontally facing relationship to the target 518.

The masks 508, 510, 512 and the support member 514 are made of a metal such as copper, for example. The electromagnet 520 is electrically connected to a DC power supply 521 via a controller 519 which controls the intensity of a current flowing through the electromagnet 520.

A coaxial cylindrical permanent magnet 522 is disposed in an upper region of the sputtering source 504 vertically upwardly of the target 518. The permanent magnet 522 has an outer circumferential region serving as an N pole and an inner circumferential region serving as an S pole.

The outer mask 508 has a lower opening 524 defined centrally therein which has a diameter slightly smaller than the outside diameter of the substrate 202. The outer mask 508 also has a tapered surface 526 and a horizontal surface 528 on a lower inner wall thereof to define a lower portion of the sputtering space 506 which is progressively spread upwardly from the lower opening 524.

Specifically, the lower inner wall of the outer mask 508 includes a first vertical surface 530 extending upwardly over a vertical distance A from the lower opening 524, the tapered surface 526 extending obliquely outwardly and upwardly over a vertical distance B from an upper end of the first vertical surface 530, the horizontal surface 528 extending horizontally outwardly over a predetermined distance from an upper end of the tapered surface 526, and a second vertical surface 532 extending upwardly from an outer end of the horizontal surface 528 to an upper end of the outer mask 508. The vertical distance A over which the first vertical surface 530 extends should preferably be 0.4 mm, for example.

A gas inlet hole 534 is defined between the outer mask 508 and the upper mask 512 and connected to a gas conduit 536 which is connected to a gas source. An atmospheric gas, e.g., an Ar gas, is introduced into the sputtering space 506 via the gas conduit 536 and the gas inlet hole 534.

A predetermined voltage ranging from 400 to 500 V is applied between the masks 508, 510, 512 which serve as an anode and the target 518 which serves as a cathode.

The sputtering mechanism 88 forms the light reflecting layer 208 as follows: An atmospheric gas, e.g., an Ar gas, which is introduced into the sputtering space 506 via the gas inlet hole 534 is ionized to produce Ar ions and electrons, generating a plasma.

The Ar ions impinge upon the target 518 as the cathode. The energy of the Ar ions is transferred from atoms to atoms of the target 518, expelling atoms of the target 518 near its surface into the sputtering space 506 kept in a vacuum. The expelled atoms reach the surfaces of the substrate 202 and the masks 508, 510, 512, forming a light reflecting layer 208 of Ag, for example, on the substrate 202.

At this time, electrons from the target 518 are attracted to the anode, i.e., the outer mask 508 and the inner mask 510, by a magnetic field that is generated by the electromagnet 520 and the permanent magnet 522. The atmospheric gas should preferably be a gas which does not react with the metal of the target 518 during the sputtering process, e.g., an Ar gas, an $N_2$ gas, or the like.

In the first embodiment, the characteristic inspecting mechanism 108 positioned downstream of the sputtering mechanism 88 inspects signal characteristics due to grooves formed in the substrate 202. If it is found that the film thickness of the light reflecting layer 208 suffers irregularities based on the inspected result, then the controller 519 controls the intensity of the current that flows through the electromagnet 520. The intensity of the current that flows through the electromagnet 520 may be controlled either manually or automatically.

Figure 8:
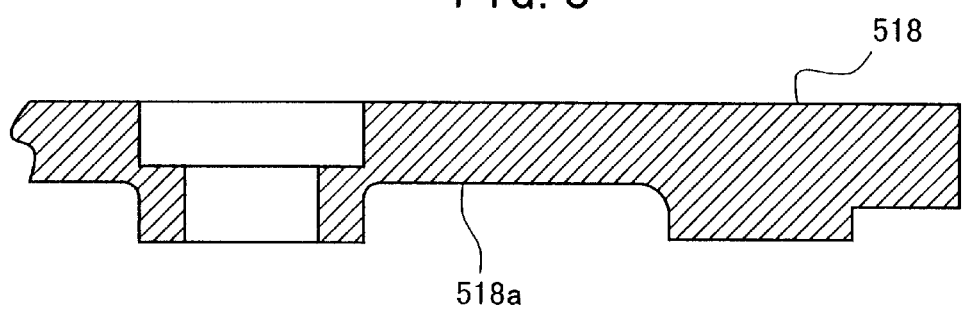
FIG. 8 is a fragmentary vertical cross-sectional view of a target after a light reflecting layer is formed.

In this manner, the intensity and distribution of the magnetic field that is generated by the electromagnet 520 and the permanent magnet 522 can be controlled as desired to prevent ions in the plasma in the sputtering space 506 from concentrating on a local area on the surface of the target 518. Therefore, ions in the plasma impinge substantially uniformly upon the surface of the target 518. As shown in FIG. 8, the target 518 has its surface 518a uniformly eroded by those plasma ions, so that the light reflecting layer 208 can be formed substantially uniformly on the dye recording layer 204 for reduced jitter.

Furthermore, because the surface 518a of the target 518 is eroded to a substantially uniform depth, the target 518 has its volume consumed at an increased ratio for a longer service life.

In the first embodiment, the flow rate of the atmospheric gas and the pressure in the tubular chamber 502 are set to such values that any in-plane variations of the film thickness of the light reflecting layer 208 are held to 10% or less.

The flow rate of the atmospheric gas should be in the range from 0.5 to 90 SCCM, preferably in the range from 1 to 70 SCCM, and more preferably in the range from 2 to 60 SCCM. The pressure in the tubular chamber 502 should be in the range from 0.1 to 18 Pa, preferably in the range from 0.5 to 15 Pa, and more preferably in the range from 1 to 12 Pa. The sputtering output should be in the range from 2 to 5 kW, and the sputtering time should be in the range from 4 to 5 seconds.

The light reflecting layer 208 may be grown stably and continuously with a high yield according to various processes described below.

(1) The diameter of the lower opening 524 in the output mask 508 is made slightly smaller than the outside diameter of the substrate 202. For example, if the outside-diameter of the substrate 202 is 120 mm, then the light reflecting layer 208 whose outside diameter of 119 mm, for example, is formed.

(2) In order to allow sputtering layers deposited on the outer mask 508 and the inner mask 510 to be removed easily, the surfaces of the outer mask 508 and the inner mask 510 are plated or coated with carbon. If the surfaces of the outer mask 508 and the inner mask 510 are plated, then they should be placed with Ni—Zn.

(3) A deposition prevention plate 538 of stainless steel is positioned over the inner wall of the outer mask 508, at a portion of the horizontal surface 528 and the second vertical surface 532 where sputtering layers can be deposited. The deposition prevention plate 538 is effective to prevent a sputtering layer from being deposited on the horizontal surface 528 and the second vertical surface 532. Any sputtering layer deposited on the deposition prevention plate 538 can easily be removed in an maintenance process.

(4) The sputtering space 506 has a height which is set to 40 mm that is greater than a standard height of 30 mm. While the increased height of the sputtering space, 506 lowers the sputtering rate, it can improve the distribution of film thicknesses of the light reflecting layer 208 formed on the substrate 202.

(5) Those components involved in the sputtering process, e.g., the substrate 202 and the target 518, are kept out of contact with operator's hands.

(6) When the interior of the chamber 502 is vented to the atmosphere, a pre-sputtering process is carried out to keep an environment suitable for sputtering in the chamber 502 for a next sputtering cycle.

(7) The target 518 is stored in an oxygen-free environment.

A process of manufacturing an optical disk D with the production system 10 will be described below with reference to FIGS. 9A through 10B.

Figure 9A:
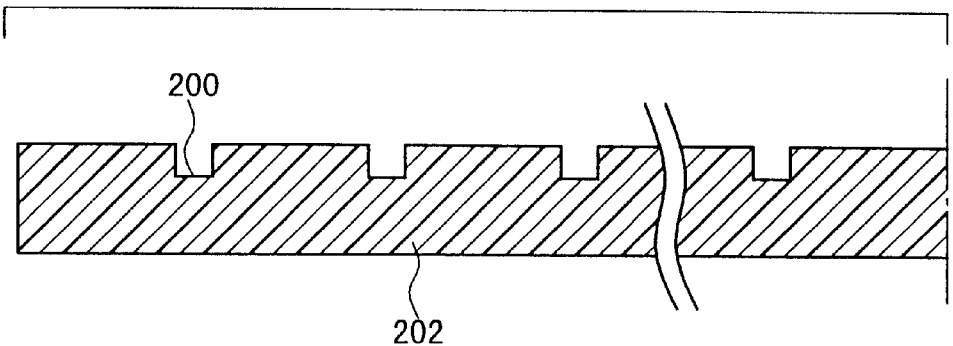
FIG. 9A is a fragmentary cross-sectional view of a substrate with grooves defined therein.

Each of the molding machines 20 of the first and second molding facilities 12A, 12B forms a substrate 202 of resin such as polycarbonate or the like according to injection molding, compression molding, or injection compression molding. As shown in FIG. 9A, the substrate 202 has grooves (recesses and protrusions) 200 serving as tracking grooves or representing information such as address signals on one principal surface thereof.

The material for the substrate 202 includes, for example, polycarbonate, acrylic resin such as polymethyl methacrylate, vinyl chloride-based resin such as polyvinyl chloride and vinyl chloride copolymer, epoxy resin, amorphous polyolefine, and polyester. These materials may be used in combination, if desired. Among the materials described above, it is preferable to use polycarbonate in view of, for example, the moisture resistance, the dimensional stability, and the price. The depth of the groove 200 is preferably within a range of 0.01 to 0.3 $\mu$m. The half value width is preferably within a range of 0.2 to 0.9 $\mu$m.

The substrates 202 removed from the molding machines 20 are cooled by the cooling units 22, and then stacked on the stack poles 24 with their principal surfaces facing downwardly. When a predetermined number of substrates 202 are stacked on each of the stack poles 24, the stack poles 24 are removed from the first and second molding facilities 12A, 12B, and fed to the coating facility 14 where the stack poles 24 are placed in the stack pole storage unit. 40. The stack poles 24 may be fed by a carriage or a self-propelled feed unit.

Figure 9B:
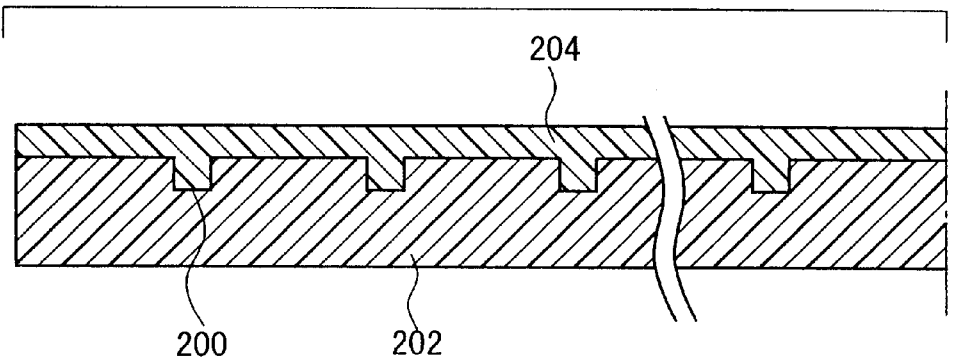
FIG. 9B is a fragmentary cross-sectional view of the substrate with a dye recording layer deposited thereon.

When the stack poles 24 are placed in the stack pole storage unit 40, the first feed mechanism 42 operates to take one at a time of the substrates 202 from the stack poles 24, and feed the substrate 202 to the electrostatic blowing mechanism 44. The electrostatic blowing mechanism 44 removes electrostatic charges from the substrate 202, which is then fed by the second feed mechanism 46 to the dye coating mechanism 48 where the substrate 202 is supplied to either one of the six spin coating devices 52. In the spin coating device 52, the principal surface of the substrate 202 is coated with a dye solution, and then the substrate 202 is rotated at a high speed to uniformize the thickness of the coated dye solution. Thereafter, the coated dye solution is dried into a dye recording layer 204 on the principal surface of the substrate 202, as shown in FIG. 9B.

More specifically, when the substrate 202 is supplied to the spin coating device 52, the substrate 202 is fixedly mounted on the spinner head 402 as shown in FIG. 2 and held horizontally by the fixture 420. The coating solution is supplied from the pressurizing tank to the discharged solution regulating valve 408, which drops a predetermined amount of the coating solution via the nozzle 406 onto a radially inner area of the substrate 202.

As described above, the nozzle 406 has the following surface. That is, the portion, which includes the forward end surface 440 of the main nozzle body 432 and the outer or inner wall surface or both of the outer and inner wall surfaces 442, 444 ranging over the distance of not less than 1mm from the forward end surface 440, is composed of the fluorine compound. Therefore, the coating solution is less liable to be attached to the nozzle 406, and hence when the coating solution is dried, the dye is prevented from being precipitated and deposited on the nozzle 406. Consequently, the spin coating device 52 can smoothly form a coated film on the substrate 202 without causing problems such as coating defects.

The coating solution comprises a dye solution which comprises a solvent and a dye dissolved therein. The dye in the dye solution has a concentration which generally ranges from 0.01 to 15 weight %, more preferably from 0.1 to 10weight %, particularly preferably from 0.5 to 5 weight %, or most preferably from 0.5 to 3 weight %.

The spinner head 402 can be rotated at a high speed by the motor. When the spinner head 402 is rotated at a high speed, the coating solution dropped on the substrate 202 flows radially outwardly on the surface of the substrate 202 under centrifugal forces, and reaches the outer circumferential edge of the substrate 202 while forming a coated film on the substrate 202. An excessive amount of the coating solution that flows radially outwardly beyond the outer circumferential edge of the substrate 202 is thrown off the substrate 202 under centrifugal forces and scattered around the outer circumferential edge of the substrate 202. The scattered excessive amount of the coating solution impinges upon the scattering prevention wall 404, is collected by a receptacle disposed below the scattering prevention wall 404, and then recovered through the drain pipe 424. The coated film on the substrate 202 is dried while and after the coating film is formed on the substrate 202. The coated film (the dye recording layer) 204 has a thickness generally in the range from 20 to 500 nm, or preferably in the range from 50 to 300 nm.

The dye to be used for the dye recording layer 204 is not specifically limited. Those usable as the dye include, for example, cyanine dye, phthalocyanine dye, imidazoquinoxaline dye, pyrylium dye, thiopyrylium dye, azulenium dye, squalirium dye, metal complex dye based on, for example, Ni or Cr, naphthoquinone dye, anthraquinone dye, indophenol dye, indoaniline dye, triphenylmethane dye, merocyanine dye, oxonol dye, aminium dye, diimmonium dye, and nitroso compound. Among these dyes, it is preferable to use cyanine dye, phthalocyanine dye, azulenium dye, squalirium dye, oxonol dye, and imidazoquinoxaline dye.

The solvent of the application agent for forming the dye recording layer 204 includes, for example, ester such as butyl acetate and cellosolve acetate; ketone such as methyl ethyl ketone, cyclohexanone, and methyl isobutyl ketone;

chlorinated hydrocarbon such as dichloromethane, 1,2-dichloroethane, and chloroform; amide such as dimethylformamide, hydrocarbon such as cyclohexane; ether such as tetrahydrofuran, ethyl ether, and dioxane; alcohol such as ethanol, n-propanol, isopropanol, n-butanol, and diacetone alcohol; fluorine solvent such as 2,2,3,3, -tetrafluoro-1-propanol, and glycol ether such as ethylene glycol monomethyl ether, ethylene glycol monoethyl ether, and propylene glycol monomethyl ether.

The solvent may be used singly or in combination of two or more species in an appropriate manner considering the dissolving property of the dye to be used. Preferably, the fluorine solvent such as 2,2,3,3, -tetrafluoro-1-propanol is used. An anti-fading agent and a binder may be added to the dye solution, if desired. Further, a variety of additives such as an antioxidant, a UV-absorbing agent, a plasticizer, and a lubricant may be added to the dye solution depending on the purpose of the use.

Representative examples of the anti-fading agent include nitroso compound, metal complex, diimmonium salt, and aminium salt. These examples are described, for example, in respective patent documents such as Japanese Laid-Open Patent Publication Nos. 2-300288, 3-224793, and 4-146189.

The binder includes, for example, natural organic high-molecular compound such as gelatin, cellulose derivative, dextran, rosin, and rubber; and synthetic organic high-molecular compound including, for example, hydrocarbon resin such as polyethylene, polypropylene, polystyrene, and poly-isobutylene, vinyl resin such as polyvinyl chloride, polyvinyl vinylidene, and polyvinyl chloride-polyvinyl acetate copolymer, acrylic resin such as polymethyl acrylate and polymethyl methacrylate, polyvinyl alcohol, chlorinated polyethylene, epoxy resin butylal resin, rubber derivative, and initial condensate of thermosetting resin such as phenol-formaldehyde resin.

If a binder is used, then it should be of at most 20 weight parts, preferably at most 10 weight parts, and more preferably at most 5 weight parts with respect to 100 weight parts of the dye.

An undercoat layer may be deposited on the surface of the substrate 202 on which the dye recording layer 204 is disposed, for the purposes of improving the planarity, increasing the bonding strength, and preventing the dye recording layer 204 from being modified.

The material for the undercoat layer includes, for example, high-molecular compound such as polymethyl methacrylate, acrylic acid-methacrylic acid copolymer, styrene-maleic anhydride copolymer, polyvinyl alcohol, N-methylol acrylamide, styrene-vinyltoluene copolymer, chlorosulfonated polyethylene, nitrocellulose, polyvinyl chloride, chlorinated polyolefine, polyester, polyimide, vinyl acetate-vinyl chloride copolymer, ethylene-vinyl acetate copolymer, polyethylene, polypropylene, and polycarbonate; and surface modifier such as silane coupling agent.

The undercoat layer can be formed by dissolving or dispersing one of the above materials into a suitable solvent to prepare an undercoat layer solution, and then coating the undercoat layer solution on the substrate surface according to a coating process such as a spin coating process, a dip coating process, an extrusion coating process, or the like. The undercoat layer is applied to a thickness which generally ranges from 0.005 to 20 $\mu$m, and preferably ranges from 0.01 to 10 $\mu$m.

The substrate 202 with the dye recording layer 204 formed thereon is fed by the third feed mechanism 50 to the reverse cleaning mechanism 54, which cleans the reverse surface of the substrate 202 which is opposite to the principal surface thereof. Thereafter, the substrate 202 is delivered by the fourth feed mechanism 56 to the number assigning mechanism 58, which assigns a number such as a lot number to the principal or reverse surface of the substrate 202.

Thereafter, the substrate 202 is fed by the fifth feed mechanism 60 to the film thickness inspecting mechanism 62 which inspects any defect on the substrate 202 and the film thickness of the dye recording layer 204. Specifically, the film thickness inspecting mechanism 62 applies light to the reverse side of the substrate 202 and processes an image of light transmitted through the substrate 202 and the dye recording layer 204 with a CCD camera. The inspected result from the film thickness inspecting mechanism 62 is sent to the sorting mechanism 68.

Based on the inspected result from the film thickness inspecting mechanism 62, the sorting mechanism 68 sorts the inspected substrate 202 selectively to the stack pole 64 for normal substrates or the stack pole 66 for defective substrates.

When a predetermined number of substrates 202 are stacked on the stack pole 64 for normal substrates, the stack pole 64 for normal substrates is removed from the coating facility 14, and fed to the post-treatment facility 16 where it is stored in the stack pole storage unit 80.

The stack pole 64 may be fed by a carriage or a self-propelled feed unit.

When the stack pole 64 for normal substrates is stored in the stack pole storage unit 80, the sixth feed mechanism 82 operates to remove one at a time of the substrates 202 from the stack pole 64 and feed the substrate 202 to the first electrostatic blowing mechanism 84. The first electrostatic blowing mechanism 84 removes electrostatic charges from the substrate 202, which is then delivered by the seventh feed mechanism 86 to the sputtering mechanism 88.

Figure 9C:
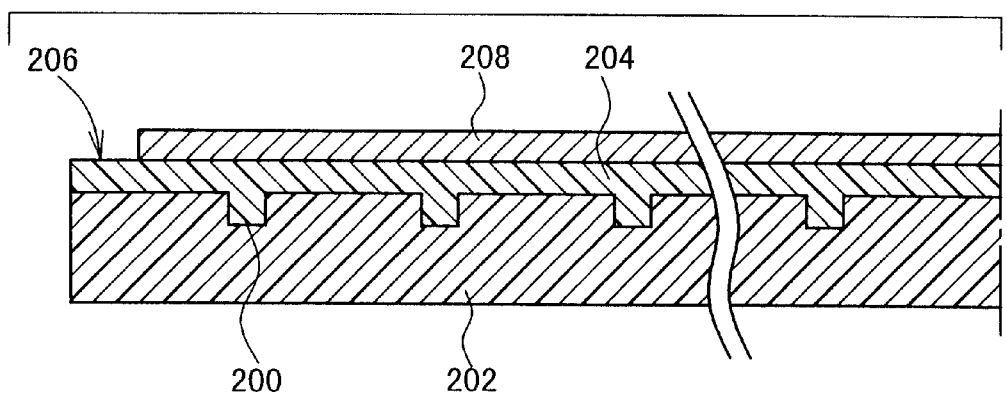
FIG. 9C is a fragmentary cross-sectional view of the substrate with a light reflecting layer disposed on the dye recording layer.

When the substrate 202 is supplied to the sputtering mechanism 88, as shown in FIG. 9C, a light reflecting layer 208 is formed, by sputtering, on the entire principal surface of the substrate 202 except for a peripheral edge 206 thereof.

The light reflecting layer 208 is made of a light reflecting material which has a high reflectance with respect to a laser beam. For example, the light reflecting material may be a metal or a semimetal such as Mg, Se, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Te, Pb, Po, Sn, Bi, or the like, or stainless steel.

Of these materials, Cr, Ni, Pt, Cu, Ag, Au, Al, and stainless steel are preferable. These materials may be used alone or in a combination of or as an alloy of at least two materials. Particularly preferable is Ag or an alloy thereof.

The light reflecting layer 208 can be formed on the dye recording layer 204 by evaporating, sputtering, or ionplating the light reflecting material. The light reflecting layer 208 has a thickness generally in the range from 10 to 800 nm, preferably in the range from 20 to 500 nm, or more preferably in the range from 50 to 300 nm.

Figure 10A:
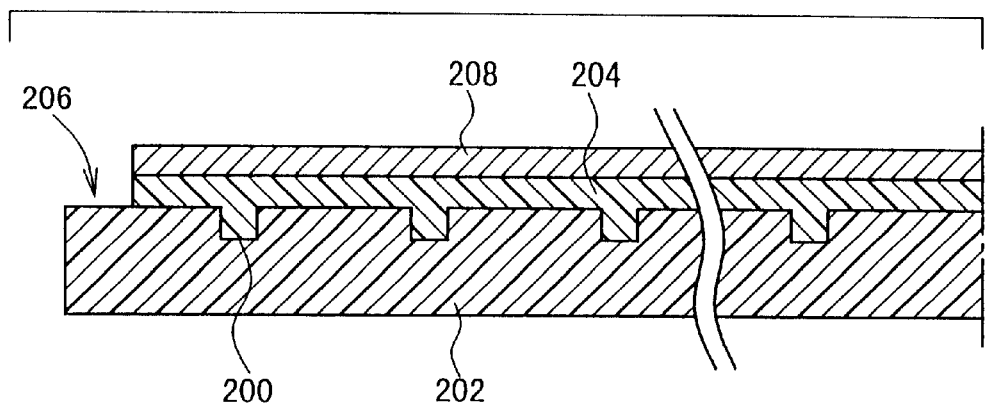
FIG. 10A is a fragmentary cross-sectional view of the substrate with its edge cleaned.

The substrate 202 on which the light reflecting layer 208 is formed is fed by the eighth feed mechanism 90 to the edge cleaning mechanism 92, which, as shown in FIG. 10A, cleans the edge 206 of the principal surface of the substrate 202 to removes the dye recording layer 204 from the edge 206. Thereafter, the substrate 202 is delivered by the ninth feed mechanism 102 to the second electrostatic blowing mechanism 94, which removes electrostatic charges from the substrate 202.

Thereafter, the substrate 202 is fed by the ninth feed mechanism 102 to the Uw-curable solution coating mechanism 96, which drops an Uw-curable solution onto a portion of the principal surface of the substrate 202. Then, the substrate 202 is fed by the ninth feed mechanism 102 to the spinning mechanism 98, which rotates the substrate 202 at a high speed to spread the dropped Uw-curable solution to a uniform film thickness over the entire principal surface of the substrate 202.

In the first embodiment, the process time is managed such that the period of time spent after the growth of the light reflecting layer 208 until the coating of the UV-curable solution is in the range from 2 seconds to 5 minutes.

Figure 10B:
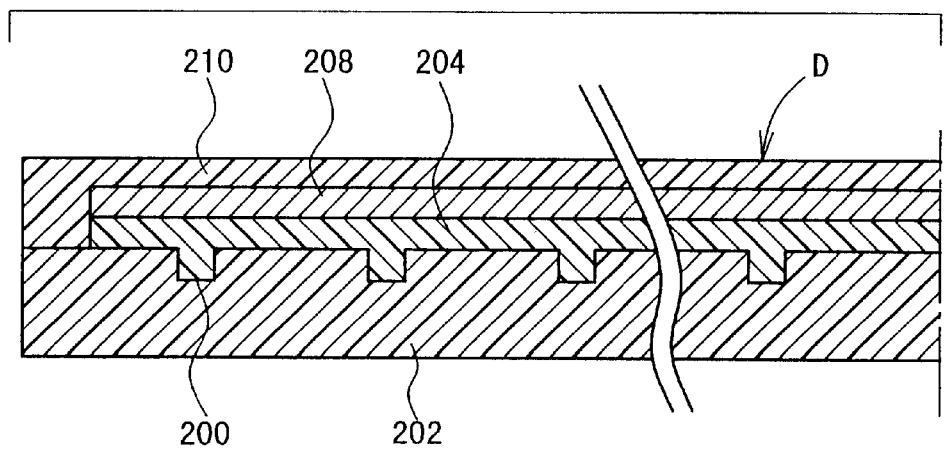
FIG. 10B is a fragmentary cross-sectional view of the substrate with a protective layer disposed thereon.

Thereafter, the substrate 202 is fed by the ninth feed mechanism 102 to the Uw applying mechanism 100, which applies ultraviolet rays to the Uw-curable solution on the substrate 202. As shown in FIG. 10B, the UV-curable solution is cured into a protective layer 210 covering the dye recording layer 204 and the light reflecting layer 208, thus completing an optical disk D.

The protective layer 210 is disposed on the light reflecting layer 208 for physically and chemically protecting the dye recording layer 204. The protective layer 210 may also be formed on the surface of the substrate 202 opposite to the dye recording layer 204 for the purpose of increasing the scratch resistance and the moisture resistance of the optical disk D. The protective layer 210 may be made of an inorganic substance such as SiO, $SiO_2$, $MgF_2$, $SnO_2$, $Si_3N_4$, or the like, or an organic substance such as a thermoplastic resin, a thermosetting resin, an UV-curable resin, or the like.

The protective layer 210 may alternatively be formed by laminating a film produced by extruding plastics on the light reflecting layer 208 and/or the substrate 202,with an adhesive. Further alternatively, the protective layer 210 may be formed by a process such as vacuum evaporation, sputtering, coating, or the like. If the protective layer 210 is made of a thermoplastic resin or a thermosetting resin, then it is formed by dissolving one of these materials into a suitable solvent to prepare a protective layer solution, and then coating the protective layer solution on the substrate surface and drying the coated protective layer solution.

If the protective layer 210 is made of a UV-curable resin, then it is formed by coating the UV-curable resin directly on the substrate surface or dissolving one UV-curable resin into a suitable solvent to prepare a protective layer solution, and coating the protective layer solution on the substrate surface, and then applying ultraviolet rays to cure the coated UV-curable resin. Various additives including a charge inhibitor, an oxidation inhibitor, an UV absorbent, etc. may be added to the protective layer solution.

The protective layer 210 has a thickness generally in the range from 0.1 to 100 µm.

Subsequently, the optical disk D is fed by the tenth feed mechanism 104 to the defect inspecting mechanism 106 and the characteristic inspecting mechanism 108, which inspect the dye recording layer 204 and the protective layer 210 for defects on their surfaces and also inspect signal characteristics due to the grooves 200 formed in the substrate 202 of the optical disk D. Specifically, each of the defect inspecting mechanism 106 and the characteristic inspecting mechanism 108 applies light to both surfaces of the optical disk D and processes an image of light reflected thereby with a CCD camera. The inspected results obtained by the defect inspecting mechanism 106 and the characteristic inspecting mechanism 108 are transmitted to the sorting mechanism 114.

The optical disk D after it has been inspected for defects and signal characteristics is sorted by the sorting mechanism 114 selectively to the stack pole 110 for normal disks and the stack pole 112 for defective disks depending on the inspected results.

When a predetermined number of optical disks D are stacked on the stack pole 110 for normal disks, the stack pole 110 is removed from the post-treatment facility 16 and delivered to a non-illustrated label printing process.

In the first embodiment, the light reflecting layer 208 is formed on the dye recording layer 204. However, the light reflecting layer 208 may first be formed on the substrate 202, and the dye recording layer 204 may then be formed on the light reflecting layer 208. This modification is also applicable to second and third embodiments to be described later on.

Figure 11:
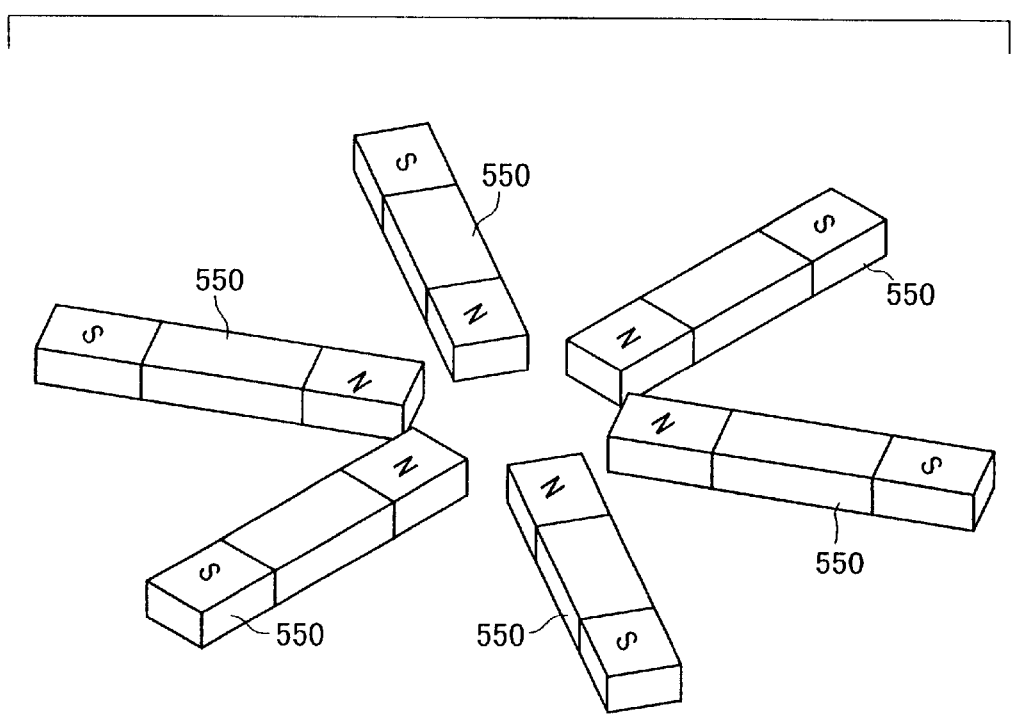
FIG. 11 is a perspective view of permanent magnets according to a modification.

In the first embodiment, the permanent magnet 522 of the sputtering mechanism 88 is of a coaxial cylindrical shape. However, as shown in FIG. 11, the sputtering mechanism 88 may employ an annular array of bar-shaped permanent magnets 550. The modification shown in FIG. 11 can also be employed in the sputtering mechanism 88 of a production system 10 according to a second embodiment to be described below.

A production system 10 according to a second embodiment of the present invention will be described below with reference to FIG. 12.

Those parts of the production system 10 according to the second embodiment which are identical to those of the production system 10 according to the first embodiment are denoted by identical reference characters, and will not be described in detail below.

The production system 10 according to the second embodiment is essentially identical to the production system 10 according to the first embodiment, but differs therefrom with respect to a portion of the sputtering mechanism 88.

Figure 12:
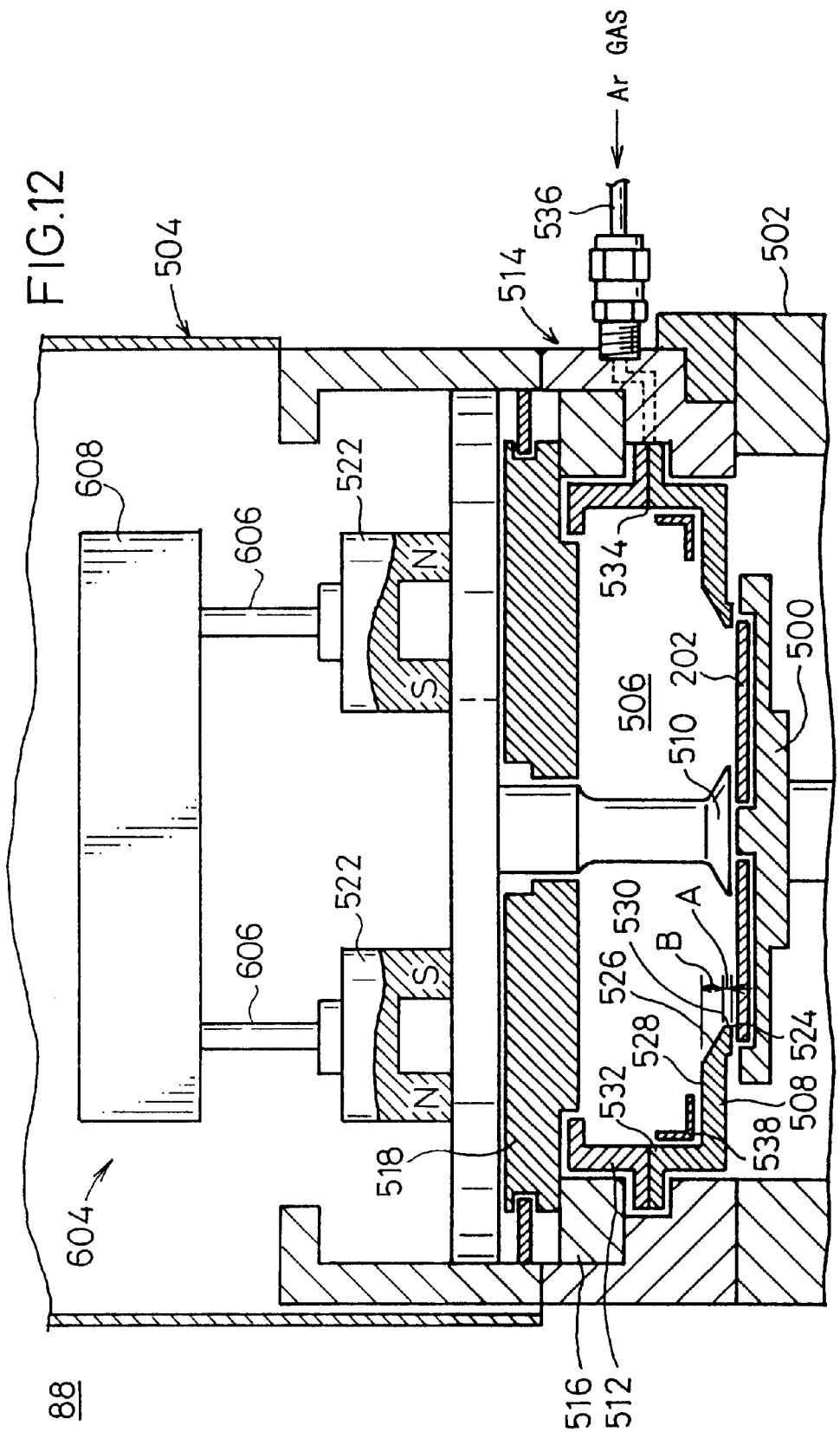
FIG. 12 is a fragmentary vertical cross-sectional view of a sputtering mechanism in a production system according to a second embodiment of the present invention.

As shown in FIG. 12, the sputtering mechanism 88 according to the second embodiment includes a coaxial: cylindrical permanent magnet 522 disposed in an upper region of the sputtering source 504 vertically upwardly of the target 518, and a displacing mechanism 604 for displacing the permanent magnet 522 parallel to the substrate 202. The permanent magnet 522 has an outer circumferential region serving as an N pole and an inner circumferential region serving as an S pole.

The displacing mechanism 604 has a plurality of holders 606 which hold the permanent magnet 522 and an actuator 608 for moving the holders 606 to displace the permanent magnet 522 parallel to the substrate 202. When the actuator 608 move the holders 606, the permanent magnet 522 is displaced within the sputtering source 504 parallel to the substrate 202 for changing the distribution of a magnetic field generated by the permanent magnet 522.

The production system 10 according to the second embodiment operates in the same manner and offers the same advantages as the production system 10 according to the first embodiment.

A production system 10 according to a third embodiment of the present invention will be described below with reference to FIG. 13.

Those parts of the production system 10 according to the third embodiment which are identical to those of the production system 10 according to the first embodiment are denoted by identical reference characters, and will not be described in detail below.

The production system 10 according to the third embodiment is essentially identical to the production system 10 according to the first embodiment, but differs therefrom with respect to a portion of the sputtering mechanism 88.

Figure 13:
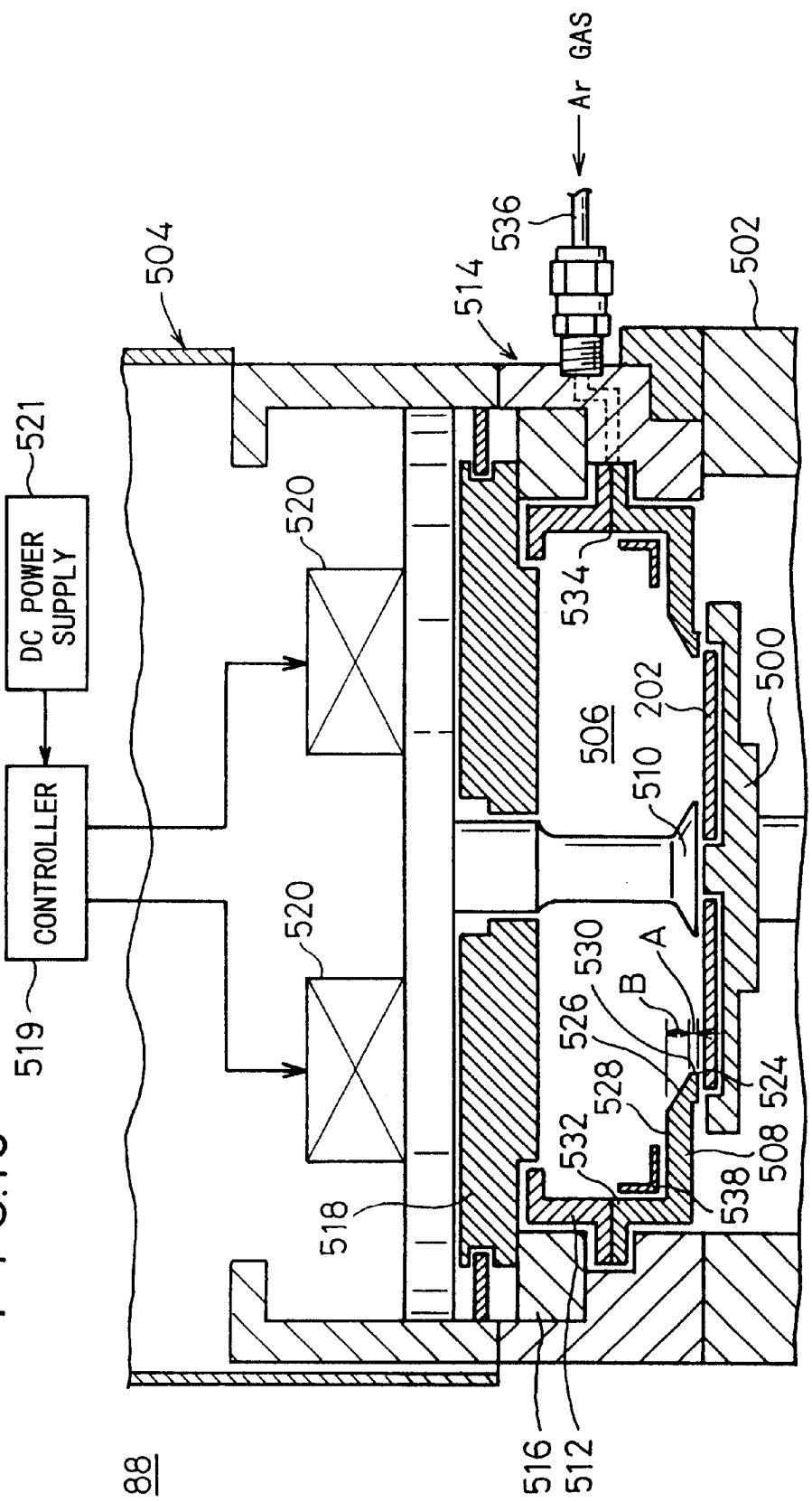
FIG. 13 is a fragmentary vertical cross-sectional view of a sputtering mechanism in a production system according to a third embodiment of the present invention.

As shown in FIG. 13, the sputtering mechanism 88 according to the third embodiment has an electromagnet 520 in the shape of a solenoid disposed on the target 518. The electromagnet 520 is electrically connected to the DC power supply 521 via the controller 519 which controls the intensity of a current flowing through the electromagnet 520.

When the controller 519 controls the intensity of a direct current flowing through the electromagnet 520, the intensity and distribution of the magnetic field that is generated by the electromagnet 520 can be controlled as desired.

outer circumferential point spaced 55 mm from the center of the substrate 202.

Each of the samples was prepared as follows: First, a substrate 202 having a thickness of 1.2 mm and a diameter of 120 mm was prepared. The substrate 202 had a spiral groove 200 having a depth of 160 nm, a width of 0.4 μm, and a track pitch of 1.6 μm.

To a cyanine dye having a benzoindorenin skeleton expressed by the general formula (1) given below, there was added 10 %, as measured against the dye, of a fading inhibitor expressed by the general formula (2) given below. The mixture was then mixed with 2,2,3,3-tetrafluoro-1-propanol expressed by the general formula (3) given below, and dissolved for two hours while being exposed to ultrasonic vibrations, thus preparing a dye solution with which to form the dye recording layer 204.

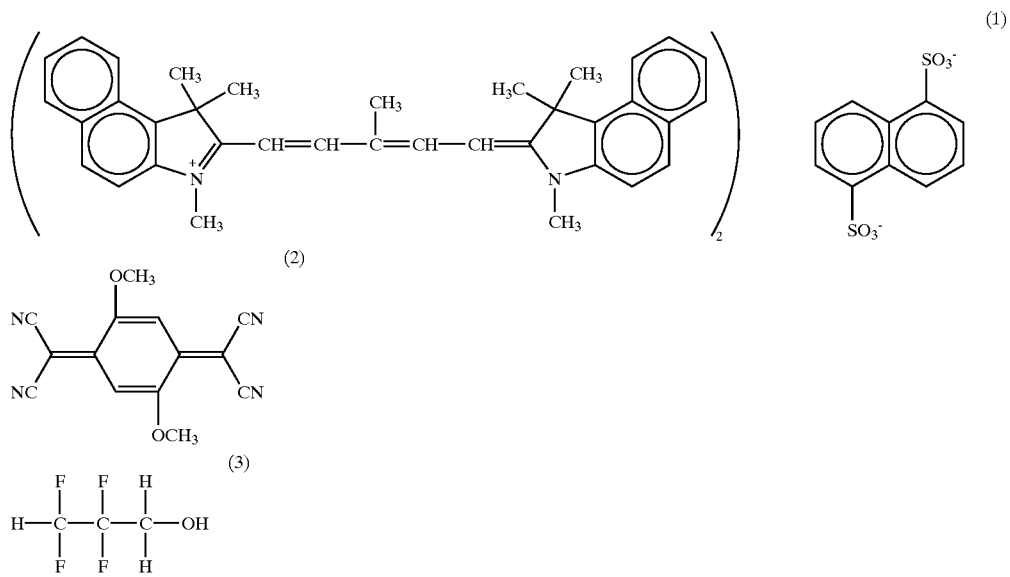

The production system 10 according to the third embodiment operates in the same manner and offers the same advantages as the production system 10 according to the first embodiment.

With the production systems 10 according to the first through third embodiments, particularly in the step of forming the light reflecting layer 208 in the fabrication process, the light reflecting layer 208 is formed on the dye recording layer 204 by controlling the intensity and distribution of a magnetic field that is generated by the electromagnet 520 and/or the permanent magnet 522. Therefore, the light reflecting layer 208 can be formed substantially uniformly on the substrate 202 for reduced jitter.

EXPERIMENTAL EXAMPLES

Samples according to Inventive Examples 1, 2 and Comparative Examples 1, 2 were prepared to fabricate optical disks D on the production system 10 shown in FIG. 1. The sputtering mechanism 88 for forming the light reflecting layer 208 was partly changed to observe the film thickness of the light reflecting layer 208 and 11T land jitter. The film thickness was measured at an inner circumferential point spaced 25 mm from the center of the substrate 202 and an The dye solution was then coated on the grooved surface of the substrate 202 according to a spin coating process while the rotational speed of the substrate 202 was changed from 300 rpm to 4000 rpm, thereby producing a dye recording layer 204.

Thereafter, a light reflecting layer 208 was formed on the dye recording layer 204 by sputtering Ag. Then, a UV-curable resin ("SD-318" manufactured by DAINIPPON INK AND CHEMICALS, INC.) was coated on the light reflecting layer 208 according to a spin coating process while the rotational speed of the substrate 202 was changed from 300 rpm to 4000 rpm. Thereafter, ultraviolet rays emitted by a highpressure mercury lamp were applied to cure the UV-curable resin into a protective layer 210 having a film thickness of about 10 μm.

In this manner, samples each comprising the substrate 202, the dye recording layer 204, the light reflecting layer 208, and the protective layer 210 were produced. The target 518 was made of Ag, and the atmospheric gas was an Ar gas.

In Inventive Example 1, the light reflecting layer 208 was formed by the sputtering mechanism 88 according to the first embodiment. The electromagnet 520 was not energized for 10 seconds from the start of the formation of the light reflecting layer 208 and energized for next 10 seconds.

In Inventive Example 2, the light reflecting layer 208 was formed by the sputtering mechanism 88 according to the second embodiment. The permanent magnet 522 was positioned in confronting relationship to an inner circumferential portion of the substrate 202 for 10 seconds from the start of the formation of the light reflecting layer 208, and positioned in confronting relationship to an outer circumferential portion of the substrate 202 for next 10 seconds.

In Comparative Example 1, the light reflecting layer 208 was formed in 20 seconds by the conventional sputtering mechanism 1 (see FIG. 15). In Comparative Example 2, the light reflecting layer 208 was formed in 25 seconds by the conventional sputtering mechanism 1 (see FIG. 15).

The results of the experimental examples were shown in FIG. 14. As can be seen from the results, when the controller 519 controls the intensity and distribution of the magnetic field that is generated by the electromagnet 520 and/or the permanent magnet 522, or when the displacing mechanism 604 displaces the permanent magnet 522 parallel to the substrate 202 to change the distribution of the magnetic field that is generated by the permanent magnet 522, the light reflecting layer 208 can be formed substantially uniformly on the substrate for reduced jitter.

Although certain preferred embodiments of the present invention have been shown and described in detail, it should be understood that various changes and modifications may be made therein without departing from the scope of the appended claims.

What is claimed is:

1. A recording medium comprising:

a substrate;

a recording layer disposed on said substrate for recording information; and a light reflecting layer disposed on said substrate;

said light reflecting layer being formed on said recording layer by a sputtering mechanism having a permanent magnet, an electromagnet, and a target while the intensity and distribution of a magnetic field generated by said permanent magnet and said electromagnet is being controlled by a controller.

2. A method of manufacturing a recording medium having a substrate, a recording layer disposed on said substrate for recording information, and a light reflecting layer disposed on said substrate, comprising the step of:

forming said light reflecting layer on said recording layer with a sputtering mechanism having a permanent magnet, an electromagnet, and a target while the intensity and distribution of a magnetic field generated by said permanent magnet and said electromagnet is being controlled by a controller.

3. A method of manufacturing a recording medium having a substrate, a recording layer disposed on said substrate for recording information, and a light reflecting layer disposed on said substrate, comprising the step of:

forming said light reflecting layer on said recording layer with a sputtering mechanism having a permanent magnet and a target while the distribution of a magnetic field generated by said permanent magnet is being changed by displacing said permanent magnet parallel to said substrate.

4. A method of manufacturing a recording medium having a substrate, a recording layer disposed on said substrate for recording information, and a light reflecting layer disposed on said substrate, comprising the step of:

forming said light reflecting layer on said recording layer with a sputtering mechanism having an electromagnet and a target while the intensity and distribution of a magnetic field generated by said electromagnet is being controlled by a controller.

5. A method according to claim 2, wherein a direct current flows through said electromagnet.

6. A method according to claim 4, wherein a direct current flows through said electromagnet.

7. A method according to claim 2, wherein said permanent magnet is of a coaxial cylindrical shape.

8. A method according to claim 3, wherein said permanent magnet is of a coaxial cylindrical shape.

9. A method according to claim 2, wherein said permanent magnet is of a bar shape.

10. A method according to claim 3, wherein said permanent magnet is of a bar shape.

11. A method according to claim 9, wherein said permanent magnet comprises an annular array of permanent magnets.

12. A method according to claim 10, wherein said permanent magnet comprises an annular array of permanent magnets.

* * * * *